United States Patent [19]

Huang et al.

[11] Patent Number: 5,856,948
[45] Date of Patent: Jan. 5, 1999

[54] SYCHRONOUS MEMORY BURN-IN METHOD

[75] Inventors: Chun-Chieh Huang, Hsinchu Hsien; Dong-Chie Liou, Nantou Hsien, both of Taiwan

[73] Assignee: United Microelectronics Corporation, Hsin-chu, Taiwan

[21] Appl. No.: 9,402

[22] Filed: Jan. 20, 1998

[30] Foreign Application Priority Data

Nov. 14, 1997 [TW] Taiwan .................................. 86116976

[51] Int. Cl.[6] ...................................................... G11C 7/00
[52] U.S. Cl. ............................................ 365/201; 365/203
[58] Field of Search ................................. 365/201, 203, 365/222

Primary Examiner—David Nelms
Assistant Examiner—David Lam
Attorney, Agent, or Firm—Merchant, Gould, Smith, Edell, Welter & Schmidt, P.A.

[57] ABSTRACT

A burn-in method for synchronous memory that utilizes synchronous signals for the burn-in operation. Using synchronous clock pulse signals for burning in the synchronous memory is able to exercise the burst output mode and the pipeline function, and hence the optimum burn-in results can be obtained. Furthermore, synchronous burn-in not only can increase the processing speed up to twice the conventional asynchronous burn-in method, but can simulate of the actual working environment of the synchronous memory as well. Moreover, an asynchronous burn-in method can be selected whenever required without any penalty.

11 Claims, 3 Drawing Sheets

SYCHRONOUS MEMORY BURN-IN METHOD

CROSS-REFERENCE TO RELATED APPLICATION

This application claims the priority benefit of Taiwan application serial no. 86116976, filed Nov. 14, 1997, the full disclosure of which is incorporated herein by reference.

BACKGROUND OF THE INVENTION

1. Field of Invention

The present invention relates to a burn-in method for synchronous memory. More particularly, the present invention relates to a method for generating burn-in signals to simulate the normal operation of synchronous memory including burst mode and pipeline functions.

2. Description of Related Art

In general, asynchronous burn-in method for asynchronous memory is used for carrying out the burn-in of conventional synchronous memory. For example, conventional extended data output (EDO) DRAMs are burn-in by the asynchronous method. However, for synchronous memory, if an asynchronous method is used in the burn-in operation, a number of advantages offered by a synchronous method are left out, and hence the possibility of hiding some untested situations are real. For example, the speed of operation tested by an asynchronous method is only half of the actual speed of operation for a synchronous memory, which can entail a high risk to the product. Furthermore, the synchronous memory tested by an asynchronous burn-in may not meet the demands in an actual working environment.

FIG. 1 is a diagram showing the pin layout of a conventional synchronous memory package. FIG. 1 shows an example of a DRAM produced by NEC with the product label μPD4516821. FIG. 2 is a timing diagram for carrying out an asynchronous burn-in operation for a synchronous memory as shown in FIG. 1.

As shown in FIG. 2, a clock pulse signal CLK in cycle T201 pre-charges the DRAM in group A, and then another clock pulse in cycle T202 pre-charges the DRAM in group B. Next, about eight clock pulses are used in cycle T203 for auto-refreshing the whole group of memory, and then the burn-in method is selected in clock pulse cycle T204. Conventionally, an asynchronous testing method is selected here. Thereafter, a clock pulse cycle T205 with no operation is effected purely as a time delay. Then, the exercising of data storage and retrieval for the DRAM begins.

As shown in FIG. 2, because an asynchronous burn-in method is selected, the subsequent clock pulse CLK for the storage and retrieval of data Dasy must go through the sequence of first activating the DRAM in group A in cycle T206, performing a write operation for the DRAM in group A in cycle T207, pre-charging the DRAM in group A in cycle T208, activating the DRAM in group B in cycle T209, performing a write operation for the DRAM in group B in cycle T210, pre-charging the DRAM in group B in cycle T211 and so on (because pipelining architecture divides the DRAM into a group A and a group B). Consequently, only 4 groups of data Dasy are written into the DRAM in the 12 clock pulse cycles CLK from T206 to T217, and hence the burst output mode and pipelining function of a synchronous memory are not exercised.

In light of the foregoing, there is a need for improving the burn-in method for exercising the underutilized functions as well.

SUMMARY OF THE INVENTION

Accordingly, the present invention is to provide a synchronous memory burn-in method that utilizes the characteristic design of synchronous memory, for example, burst output and pipeline architecture, to establish a set of synchronous clock pulse signals for carrying, out synchronous memory burn-in operation. Consequently, the optimum results can be obtained from the burn-in operation. Moreover, the method of generating the clock pulse signal is very similar to generating asynchronous testing signals, and hence no additional software or hardware is required.

To achieve these and other advantages and in accordance with the purpose of the invention, as embodied and broadly described herein, the invention provides a burn-in method for synchronous memory. The burn-in method uses synchronous signals for testing the synchronous memory. The synchronous memory includes a first group of memories and a second group of memories. Moreover, the first group of memories includes a plurality of first memory addresses, while the second group of memories includes a plurality of second memory addresses. The burn-in method comprises the steps of activating the synchronous memory, and then putting an active high at the data request mask enable pin.

Next, the first group of memories is pre-charged, and then the second group of memories is pre-charged. Thereafter, the synchronous memory is auto-refreshed, and then a synchronous burn-in method is selected for testing the synchronous memory. An inactive potential is then applied to the data request mask enable pin. Next, the first group of memories is activated, and then storage-removal operations are executed continuously with reference to the first memory addresses. Thereafter, the second group of memories is activated while the first group of memories is pre-charged at the same time, and then storage-removal operations are executed continuously with reference to the second memory addresses.

Next, the first group of memories is activated while the second group of memories is pre-charged at the same time, and then the aforementioned processes are repeated until the synchronous burn-in ends. Using a synchronous burn-in method to exercise the synchronous memory has the advantages of testing both the burst output mode and the pipelining function, and so the optimum result for burn-in testing is obtained. Furthermore, up to twice the processing efficiency and system utilization of burn-in test is achieved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
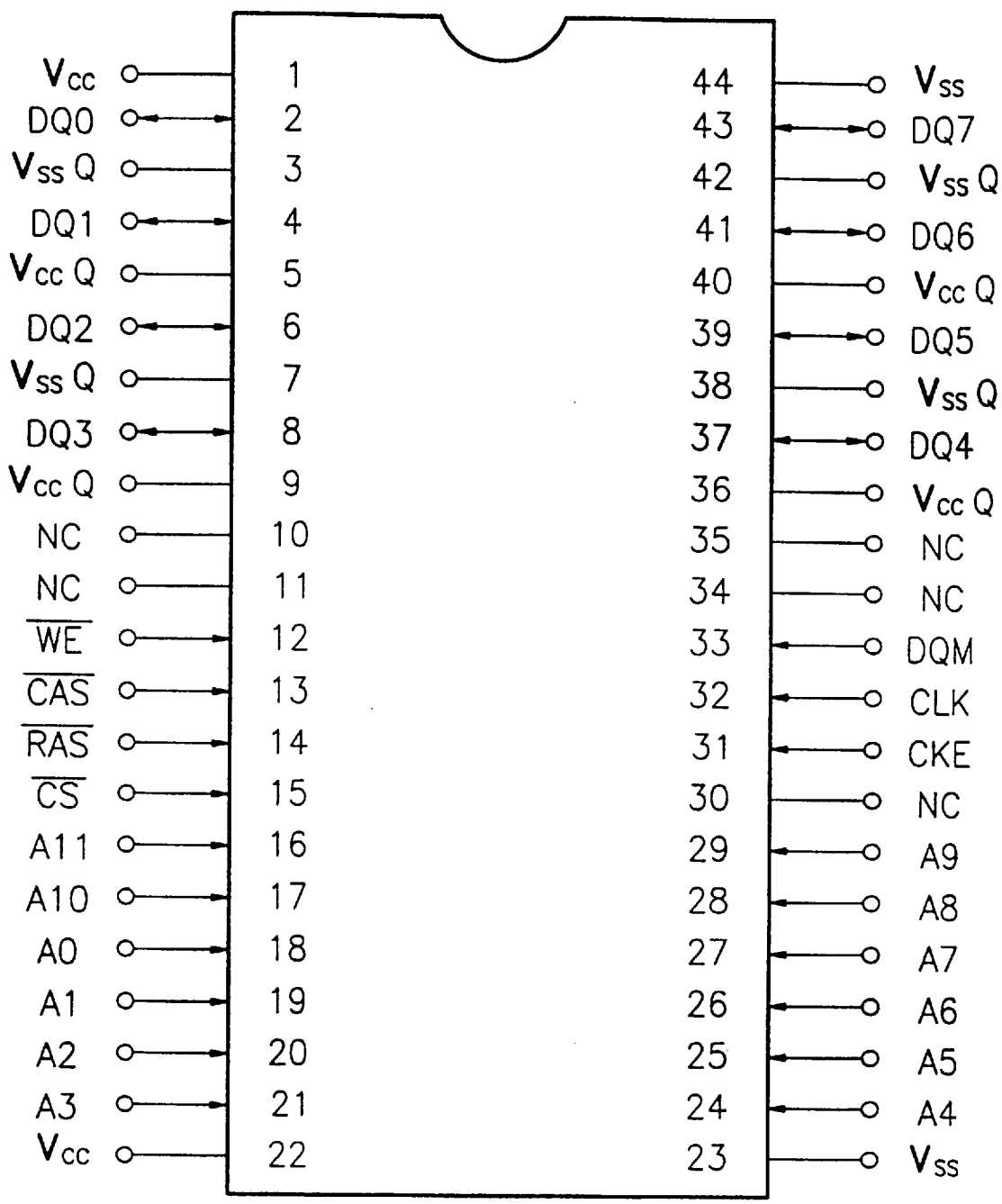
FIG. 1 is a diagram showing the pin layout of a conventional synchronous memory package.
Figure 2:
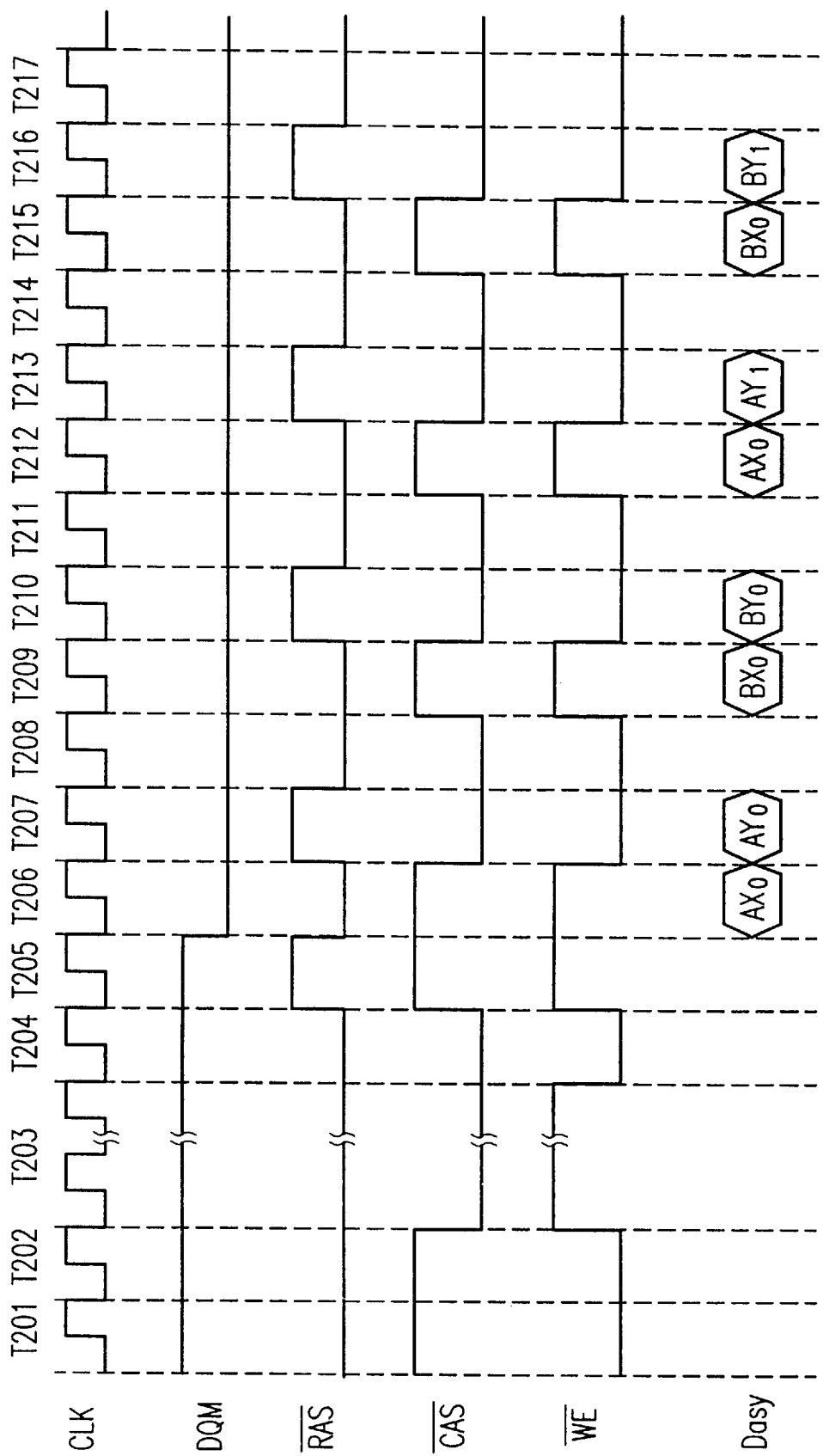
FIG. 2 is a timing diagram for carrying out an asynchronous burn-in operation for a synchronous memory as shown in FIG. 1.

Reference will now be made in detail to the present preferred embodiments of the invention, examples of which are illustrated in the accompanying drawings. Wherever possible, the same reference numbers are used in the drawings and the description to refer to the same or like parts.

This invention utilizes the burst output and the pipelining concept in the design of synchronous memory to generate the timing signals for carrying out a burn-in operation. Moreover, the timing signals generated for burn-in purpose also match the application of an actual system. Therefore, not only the optimum result for performing a burn-in operation can be obtained, but also capable of correctly simulating the actual environment a normal integrated circuit has to face.

Figure 3:
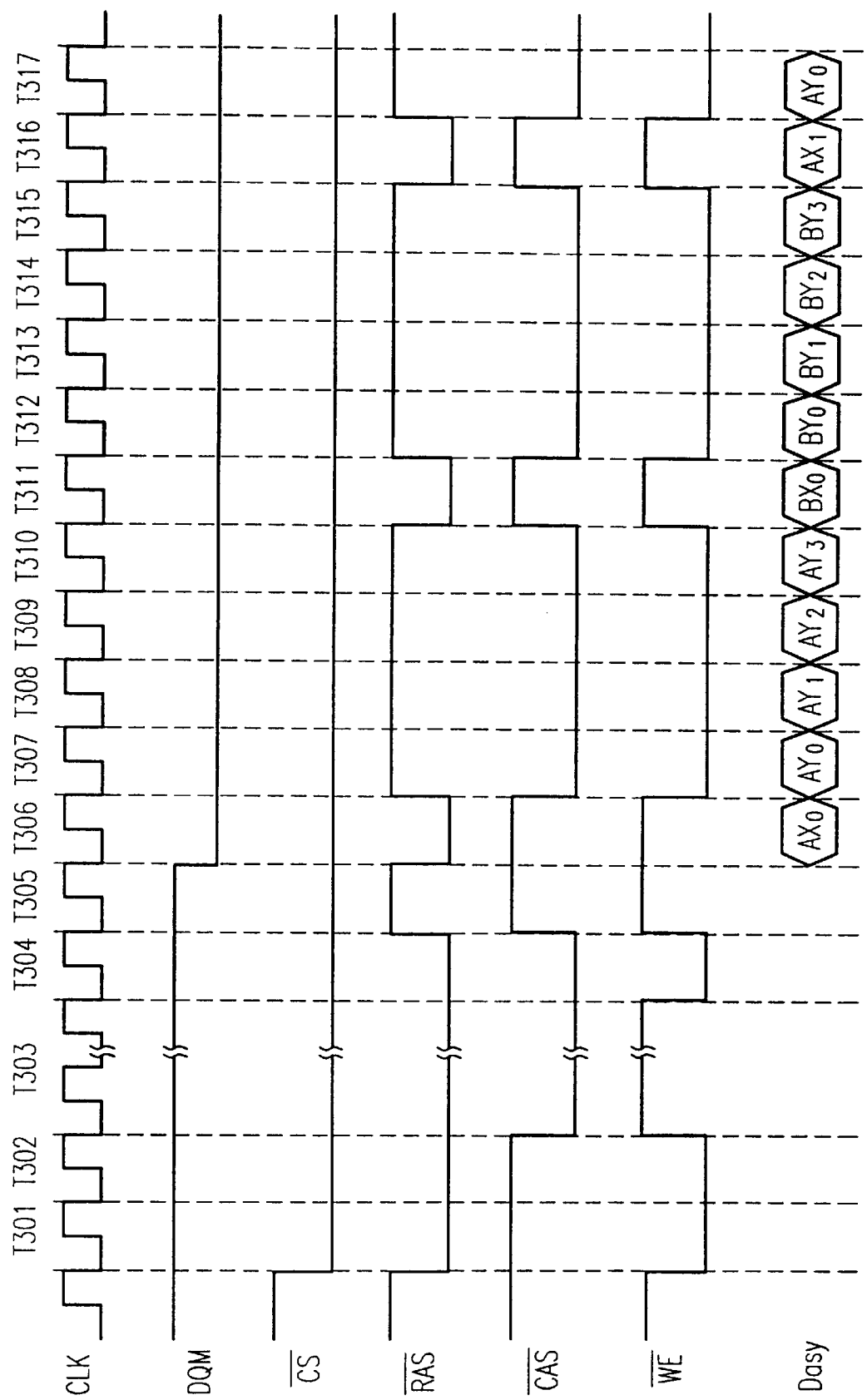
FIG. 3 is a timing diagram for carrying out a synchronous burn-in operation for a synchronous memory according to one preferred embodiment of this invention.

FIG. 3 is a timing diagram for carrying out a synchronous burn-in operation for a synchronous memory according to one preferred embodiment of this invention. The NEC synchronous DRAM as shown in FIG. 1 is used as an example. However, for static random access memories (SRAMs), similar operational procedures can be used to achieve similar result.

First, as shown in FIG. 1, pins A0 to A11 are for input of addresses, wherein pins A0 to A10 are for row address inputs, pins A1 to A8 are for column address inputs and pin A11 are for selecting DRAM in group A or DRAM in group B (in this embodiment, the synchronous DRAM is divided into two groups, namely, A & B); pins DQ1 to DQ7 are for data input/output; pin CLK is for the input of clock pulse signals; pin $\overline{CS}$ is an active low chip select input; pin $\overline{RAS}$ is an active low row address strobe input; pin $\overline{CAS}$ is an active low column address strobe input; pin $\overline{WE}$ is an active low write input; pin DQM is a data request (DQ) mask enable input; pin Vcc is a power supply input; pin Vss is a grounding input; VccQ is a power supply input for data; pin VssQ is a ground input for data; and pin NC is an unconnected input.

In FIG. 3, using memory write as an example, when the clock pulse signal CLK is in the first cycle T301, DRAM in group A are pre-charged, and then DRAM in group B are pre-charged. Next, about eight clock pulses are used in cycle T303 for auto-refreshing the memories. Thereafter, in clock pulse cycle T304, DRAM burn-in method is selected. Conventionally, an asynchronous burn-in method is selected here. In this invention, synchronous burn-in method is selected. However, if an asynchronous burn-in method is selected in this invention, the same method as in a conventional method can be used. Next, clock pulse in cycle T305 is a no operation time-delay cycle, and then data storage and retrieval to and from DRAM begins.

As shown in FIG. 3, data memory request mask pin (DQM) remains in a high potential until data storage and retrieval begins, and the chip select pin $\overline{CS}$ remains in an active low. After clock pulse cycle T305, data Dasy is stored and retrieved in a synchronous manner. Hence, the burst output mode and the pipelining architecture can be tested. For example, in clock pulse cycle T306, memories in group A are activated, and then a series of four sets of data Dasy are written into the locations indicated by the four memory addresses (a burst mode function).

After the last set of data Dasy is written, memories in B group are activated in clock pulse cycle T311, while memories in A group are pre-charged at the same time (a pipelining function). Thereafter, in clock pulse cycles T312 to T315, a series of four sets of data Dasy are written into the locations indicated by the four memory addresses of group B. The whole process is repeated afterwards. Consequently, altogether 8 sets of data are written into the DRAM in just 10 clock pulse cycles from T306 to T315. Therefore, the burn-in operation here is twice as fast as in a convention burn-in operation.

In this invention, multiplexers are used in the generation of addresses for the synchronous burn-in operation. Since the same method is used in the generation of addresses for asynchronous memories, no additional softwares are required.

As a summary, using synchronous clock pulse signals to burn-in synchronous memory is able to exercise the burst output mode and the pipelining functions. Hence, the optimum burn-in result can be obtained. Secondly, the use of synchronous clock pulse signals to exercise the synchronous memory matches the actual system working environment.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A burn-in method for testing synchronous memory that utilizes synchronous signals, wherein the synchronous memory includes a first memory group and a second memory group, and that the first memory group has a plurality of first memory addresses and the second memory group has a plurality of second memory addresses, comprising the steps of:

a. activating the synchronous memory;

b. maintaining a high potential at an active high data memory request mask pin of the synchronous memory;

c. pre-charging the first memory group;

d. pre-charging the second memory group;

e. auto-refreshing the synchronous memory;

f selecting synchronous burn-in method for exercising the synchronous memory;

g. changing to a low potential to deactivate the data memory request mask pin of the synchronous memory;

h. activating the first memory group;

i. storing and retrieving data continuously to and from the locations indicated by the first memory addresses;

j. activating the second memory group; and pre-charging the first memory group at the same time;

k. storing and retrieving data continuously to and from the locations indicated by the second memory addresses;

l. activating the first memory group; and pre-charging, the second memory group at the same time; and m. repeating the steps from i to l until the burn-in operation ends.

2. The method of claim 1, wherein an asynchronous burn-in method can be used for exercising the synchronous memory in step f.

3. The method of claim 1, wherein the synchronous burn-in operation is performed using a burst output mode.

4. The method of claim 1, wherein the synchronous burn-in operation is performed using a pipeline function.

5. A burn-in method for testing synchronous memory including a synchronous burn-in method and an asynchronous burn-in method, wherein the synchronous memory includes a first memory group and a second memory group, and that the first memory group has a plurality of first memory addresses and the second memory group has a plurality of second memory addresses, comprising the steps of a. activating the synchronous memory;
b. maintaining a high potential at an active high data memory request mask pin of the synchronous memory;
c. pre-charging the first memory group;
d. pre-charging the second memory group;
e. auto-refreshing the synchronous memory;
f selecting a burn-in method for exercising the synchronous memory;
g. changing to a low potential to deactivate the data memory request mask pin of the synchronous memory; and
h. alternately activating the first memory group and the second memory group for storing and retrieving data to and from locations indicated by the first memory addresses and the second memory addresses respectively, until the testing ends.

6. The method of claim 5, wherein when a synchronous burn-in method is selected in step f, the step h includes the substeps of:

i. activating the first memory group;
ii. storing and retrieving data continuously to and from the locations indicated by the first memory addresses;
iii. activating the second memory group; and pre-charging the first memory group at the same time;
iv. storing and retrieving data continuously to and from the locations indicated by the second memory addresses;
v. activating the first memory group; and pre-charging the second memory group at the same time; and
vi. repeating the steps from ii to vi until the burn-in operation ends.

7. The method of claim 5, wherein the synchronous burn-in operation is performed using a burst output mode.

8. The method of claim 5, wherein the synchronous burn-in operation is performed using a pipeline function.

9. A burn-in method for testing synchronous memory that utilizes synchronous signals, wherein the synchronous memory includes a first memory group and a second memory group, and that the first memory group has a plurality of first memory addresses and the second memory group has a plurality of second memory addresses, comprising the steps of:

a. activating the first memory group;
b. storing and retrieving data continuously to and from the locations indicated by the first memory addresses;
c. activating the second memory group; and pre-charging the first memory group at the same time;
d. storing and retrieving data continuously to and from the locations indicated by the second memory addresses;
e. activating the first memory group; and pre-charging the second memory group at the same time; and
f. repeating the steps from a to e until the burn-in operation ends.

10. The method of claim 9, wherein the synchronous burn-in operation is performed using a burst output mode.

11. The method of claim 9, wherein the synchronous burn-in operation is performed using a pipeline function.

* * * * *